United States Patent
Erlenbeck

(10) Patent No.: US 9,500,466 B2
(45) Date of Patent: Nov. 22, 2016

(54) ELECTRICAL POWER STEERING PHASE VOLTAGE OUTPUT DIAGNOSIS

(71) Applicant: Steering Solutions IP Holding Corporation, Saginaw, MI (US)

(72) Inventor: Jason M. Erlenbeck, Hemlock, MI (US)

(73) Assignee: STEERING SOLUTIONS IP HOLDING CORPORATION, Saginaw, MI (US)

( * ) Notice: Subject to any disclaimer, the term of this patent is extended or adjusted under 35 U.S.C. 154(b) by 148 days.

(21) Appl. No.: 14/202,658

(22) Filed: Mar. 10, 2014

(65) Prior Publication Data

US 2014/0266295 A1 Sep. 18, 2014

Related U.S. Application Data

(60) Provisional application No. 61/777,618, filed on Mar. 12, 2013.

(51) Int. Cl.
*G01B 7/30* (2006.01)
*B62D 5/04* (2006.01)
*G01R 31/34* (2006.01)

(52) U.S. Cl.
CPC .............. *G01B 7/30* (2013.01); *B62D 5/0487* (2013.01); *G01R 31/343* (2013.01)

(58) Field of Classification Search
None
See application file for complete search history.

(56) References Cited

U.S. PATENT DOCUMENTS

| | | | |
|---|---|---|---|
| 5,592,355 A | 1/1997 | Ikkai et al. | |
| 5,838,127 A * | 11/1998 | Young | H02P 6/008 318/119 |
| 6,034,493 A * | 3/2000 | Boyd | H02P 6/002 318/400.31 |
| 6,271,637 B1 | 8/2001 | Kushion | |
| 6,498,449 B1 * | 12/2002 | Chen | B62D 5/046 318/434 |
| 7,221,203 B2 | 5/2007 | Rademacher | |
| 8,405,337 B2 * | 3/2013 | Gebhart | H02P 6/002 318/400.01 |
| 8,648,561 B2 | 2/2014 | Lazar et al. | |
| 2001/0048278 A1 * | 12/2001 | Young | H02P 6/085 318/400.29 |
| 2002/0172509 A1 | 11/2002 | Kameya et al. | |
| 2013/0134918 A1 * | 5/2013 | Richards | H02P 9/02 318/490 |

FOREIGN PATENT DOCUMENTS

| | | |
|---|---|---|
| CN | 101174811 A | 5/2008 |
| CN | 101682273 A | 3/2010 |
| EP | 1298783 A2 | 4/2003 |
| EP | 1961644 A2 | 8/2008 |

OTHER PUBLICATIONS

European Patent Office Search Report for related European Patent Application No. EP14158983.8, dated Feb. 25, 2015, 6 pages.

* cited by examiner

*Primary Examiner* — Paresh Patel
(74) *Attorney, Agent, or Firm* — Cantor Colburn LLP

(57) ABSTRACT

A motor control diagnostic apparatus is provided. The apparatus includes a control module in communication with a multiple phase electric power steering motor, the control module configured to generate multiple phase duty cycle outputs based on a voltage command generated from a motor torque command and motor position. The apparatus also includes a diagnostic module configured to analyze a reasonableness of the duty cycle outputs based on comparing the duty cycle outputs to expected duty cycle outputs, wherein the expected duty cycle outputs are estimated based on determining the electrical revolution sector of each motor phase.

20 Claims, 4 Drawing Sheets

ELECTRICAL POWER STEERING PHASE VOLTAGE OUTPUT DIAGNOSIS

CROSS-REFERENCES TO RELATED APPLICATIONS

This patent application claims priority to U.S. Provisional Patent Application Ser. No. 61/777,618, filed Mar. 12, 2013, which is incorporated herein by reference in its entirety.

BACKGROUND OF THE INVENTION

Electrical power steering (EPS) systems in vehicles use an electric motor connected to the steering gear or steering column that is electronically controlled to provide a torque to assist a driver in steering the vehicle. EPS systems typically include an electric motor and controller that receives steering torque information from a torque sensor and controls the motor to transmit assist torque to the wheels, e.g., by applying the torque to the steering column. One type of motor is a Permanent Magnet (PM) brushless motor.

The controller typically controls the EPS motor by generating duty cycle signals for each motor phase, e.g., using pulse width modulation (PWM), which are used to provide phase voltage signals to the motor. As malfunctions in generating such signals can compromise the effectiveness and safety of EPS systems, diagnostic functions may be provided to monitor signal generation.

SUMMARY OF THE INVENTION

An embodiment of a motor control diagnostic apparatus includes a control module in communication with a multiple phase electric power steering motor, the control module configured to generate multiple phase duty cycle outputs based on a voltage command generated from a motor torque command and motor position. The apparatus also includes a diagnostic module configured to analyze a reasonableness of the duty cycle outputs based on comparing the duty cycle outputs to expected duty cycle outputs, wherein the expected duty cycle outputs are estimated based on determining the electrical revolution sector of each motor phase.

An embodiment of a method of performing diagnostics on an electrical power steering system includes generating, at a control module, multiple phase duty cycle outputs based on a voltage command generated from a motor torque command and a position of a multiple phase electric power steering motor. The method also includes analyzing, by a diagnostic module, a reasonableness of the duty cycle outputs based on comparing the duty cycle outputs to expected duty cycle outputs, wherein the expected duty cycle outputs are estimated based on determining the electrical revolution sector of each motor phase.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Systems, apparatuses and methods are provided for control and diagnostics in electric power steering motors. Embodiments include a diagnostic function configured to predict duty cycle values based on motor position (e.g., motor rotation sector) and compare the predicted values to duty cycle signals generated in an electric power steering (EPS) system. In one embodiment, the predicted values and/or predicted limits are based on a phase grounding table provided for each sector. The diagnostic function performs the comparison in one or multiple phases, and may perform the comparisons to verify output on all phases simultaneously or nearly simultaneously, by tracking sector determinations individually on a per phase basis. Because the sectors are tracked individually, the sector size is independent of outside influences, which provides greater coverage.

Figure 1:
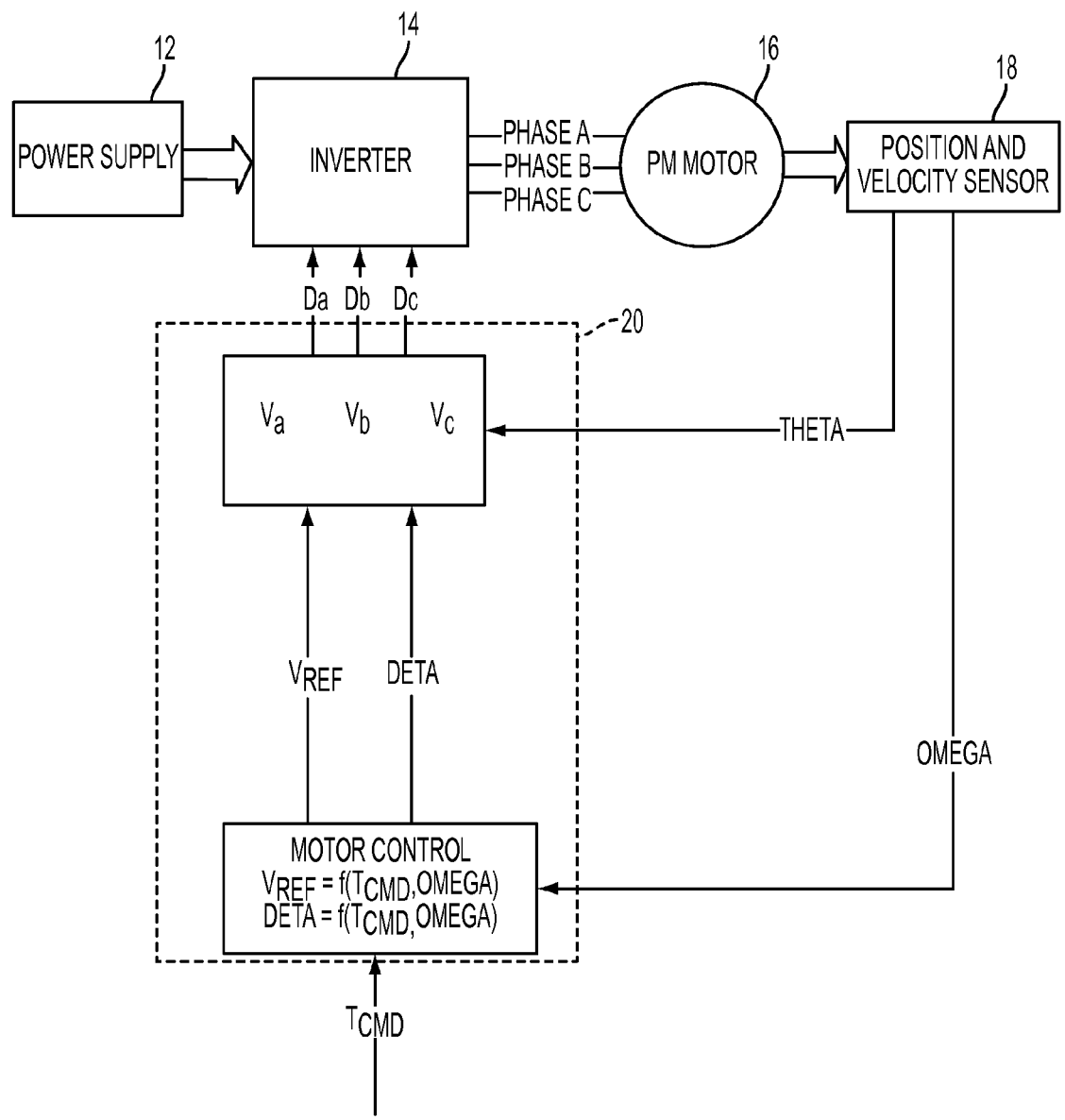
FIG. 1 is a drawing depicting an embodiment of an electric motor control system, in an exemplary embodiment of the invention.

Referring to FIG. 1, an exemplary motor control system 10 that includes a power supply 12, an inverter 14, an electric power steering (EPS) motor 16 and a position and velocity sensor 18 is provided. The sensor 18 outputs a position signal indicating the rotor angular position and the velocity to a controller 20. The controller 20 is configured to receive the position and velocity information 20 and a torque command signal $T_{CMD}$, and calculate the voltage amplitude $V_{ref}$ required to develop the desired torque in the motor 16 based on a model of the motor being controlled.

For example, the controller 20 receives a motor velocity or speed signal Ω (Omega) and calculates $V_{ref}$ and a phase advance angle δ (Delta) based on the motor model. The speed Ω may be measured and/or calculated, e.g., as the change of the motor position θ over a prescribed time interval.

For a multi-phase motor, the controller may generate voltage commands for each phase. For example, for a three-phase motor (Phase A, B and C), the controller 20 generates three phase voltage command signals Va, Vb, and Vc from the $V_{ref}$ and δ signals. For example, the controller 20 transforms Vref into three phases to generate command signals Va, Vb and Vc. Phase voltage command signals Va, Vb and Vc are used to generate motor duty cycle signals Da, Db, and Dc using a selected pulse width modulation (PWM) technique. The motor duty cycle signals of the controller 20 are applied to the inverter 14, which is configured to apply phase voltages to the stator windings of the motor 16 in response to the voltage command signals.

In a motor drive system employing phase advancing, the phase advancing angle δ (FIG. 1) may also be calculated as a function of the input signal for torque or speed. The phase voltage signals Va, Vb, Vc are then phase shifted by the phase advance angle δ. In phase advancing a field weakening current Id of the motor 20 is generated, which is out of phase with back electromotive force (BEMF) voltage of the motor 20 by about 90 degrees. Phase advancing involves allowing the phase of the voltage command to shift versus the phase of the BEMF voltage by the phase advance angle δ.

Diagnostics may be provided to analyze controller functions, including the functions of transforming the software commanded voltage (e.g., $V_{ref}$) to the hardware voltage signals that are provided to the EPS motor 16. As indicated above, the controller 20 uses a PWM switching scheme to create three phase sinusoidal voltages from input voltages to match the motor's electrical characteristics. These functions are used to apply the voltages to the motor 16 which then becomes applied torque to the EPS system, thus failures within these functions can adversely affect system safety.

Figure 2:
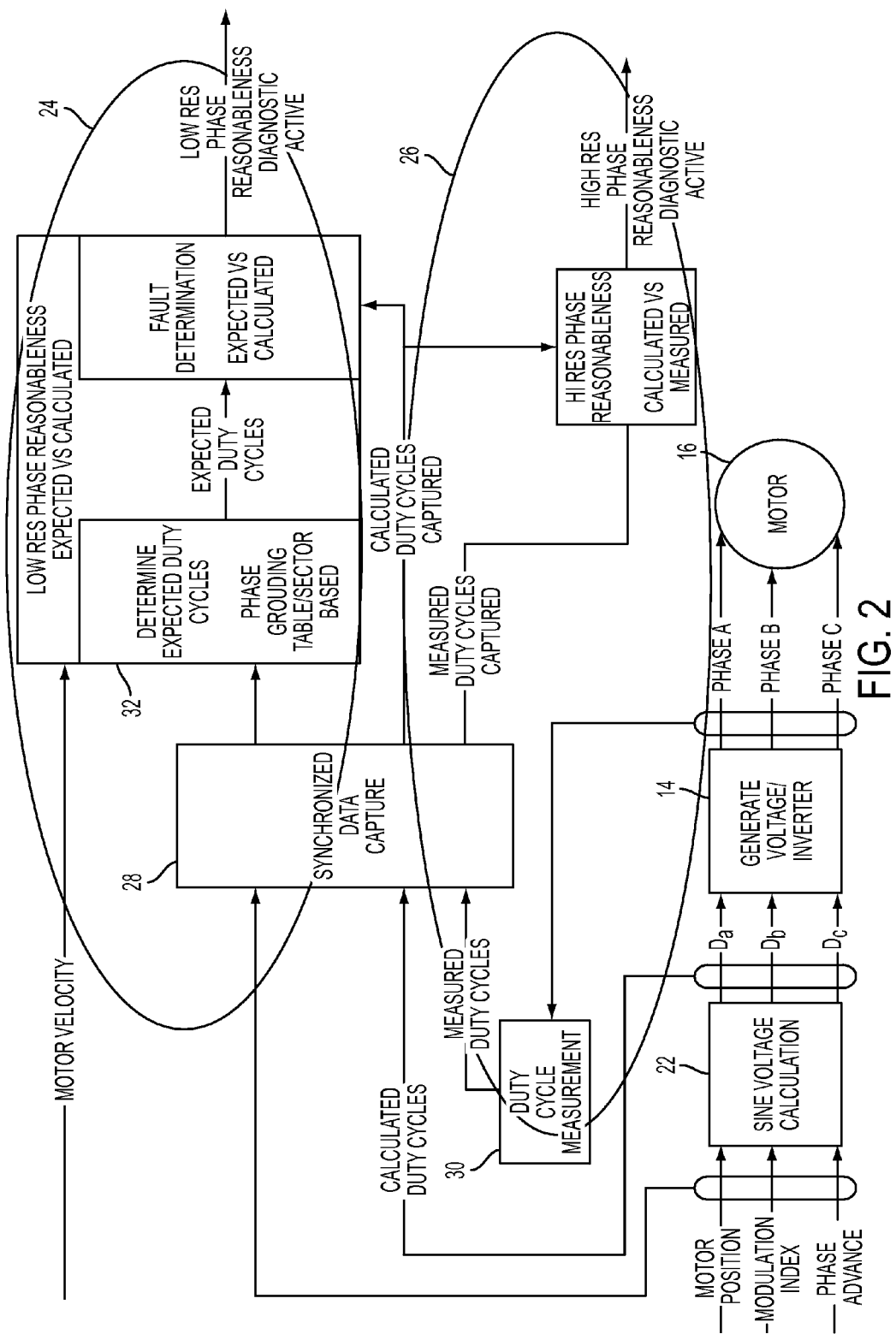
FIG. 2 depicts an embodiment of an electric motor control system including the duty cycle generator and diagnostic functions.

FIG. 2 shows aspects of the controller 20 that provide various diagnostic functions, and shows a schematic of exemplary data capture and diagnostic functions of the controller 20, performed in conjunction with generation of the duty cycle signals. The controller 20 includes a duty cycle function 22, such as a sine voltage calculation function, that calculates the duty cycle for each phase (e.g., Da, Db and Dc), which is input to the inverter 14. The duty cycles are calculated using inputs including, e.g., motor position (Motor Position), the torque command signal (Modulation Index) and the phase advance angle (Phase Advance). The calculated duty cycles are also input to various diagnostic functions, including a low resolution phase reasonableness diagnostic function 24 and a voltage signal diagnostic function 26.

The low resolution phase reasonableness (LRPR) diagnostic function 24 is configured to monitor and perform diagnostics on phase voltage output from the controller 20 by verifying whether the duty cycle output to the inverter 14 is correct based on the calculated duty cycles, the motor position and/or the torque command (modulation index) signal. For example, The LRPR diagnostic function 24 receives calculated duty cycle signals Da, Db and Dc from the voltage calculation function 22, and also receives motor position (Theta) and phase advance signals. The LRPR diagnostic function 24 generates expected duty cycles for each phase based on the electrical revolution sector derived from the motor position. In one embodiment, the expected duty cycles are generated using a phase grounding table, an example of which is described further below. The LRPR diagnostic 24 may be configured as a software-based application that can be stored at any suitable location that allows the LRPR diagnostic 24 to receive motor position data, duty cycle data and other data.

The voltage signal diagnostic function 26 is included to verify whether the inverter 14 is outputting the correct phase voltage signals (e.g., Phase A, Phase B, Phase C). The voltage signals outputted by the inverter 14 are measured, and the measured voltage signals and calculated duty cycles are input to the voltage signal diagnostic function 26, which is used to determine whether the voltages have been applied correctly from the inverter 14 to the motor 16. In one embodiment, the voltage signal diagnostic function 26 is a high resolution phase reasonableness (HRPR) diagnostic that has a relatively high resolution (e.g., sampling rate) compared to the LRPR diagnostic 24.

In one embodiment, a data capture function 28 provides various data based on the duty cycle function outputs, and can be used to collect data including inputs for the LRPR diagnostic 24 and voltage signal diagnostic 26. For example, a capture device captures duty cycle function inputs, such as Motor Position, Modulation Index and Phase advance, and another capture device captures the calculated duty cycle outputs (Calculated Duty Cycles). An example of the voltage signal diagnostic 26 includes duty cycle measurement circuitry 30 that provides diagnostic information based on physical phase voltages, including measured duty cycles. The physical phase voltages are generated by a inverter 14 using the duty cycle signals provided by the duty cycle function 22.

The low resolution phase reasonableness (LRPR) diagnostic function 24 is a diagnostic function that analyzes and/or verifies outputs of the duty cycle function 22. For example, the LRPR diagnostic function 24 estimates expected duty cycles and compares the expected duty cycles to the calculated duty cycles from the duty cycle function 22. The LRPR function 24 may be embodied as a module or logical unit in the controller 20 or in separate unit or processor.

In one embodiment, the LRPR diagnostic function 24 works by leveraging knowledge of a phase grounding table output based on motor position. For example, if the motor position over a defined time period has remained within a certain sector, the duty cycles for each phase can be predicted. Each sector corresponds to a step or portion of a 360 degree electrical revolution of the motor, and is described as a range of electrical degrees.

Exemplary inputs to the LRPR diagnostic function 24 are shown in FIG. 2. As shown in FIG. 2, one or more inputs may be taken from the data capture function 28. In one embodiment, the inputs include motor position and the phase advance angle. Other inputs may include modulation index and motor velocity. In one embodiment, the LRPR function 24 is located in a memory partition 32 that is separate from the memory partition in which the duty cycle function 22, the voltage signal diagnostic function and/or the data capture function 34 is located.

In one embodiment, inputs to the LRPR diagnostic function 24 are applied in multiple different time domains. For example, the motor position is determined at a first rate (e.g., t1 ms), the phase advance and modulation index signals are calculated at a second rate (e.g., t2 ms), and the LRPR diagnostic function 24 runs at a third rate (e.g., t3 ms). In one example, the diagnostic function runs at a faster rate than the rate of sampling or estimation of other inputs (e.g., t3 is greater than t1 and t2). In another example, the LRPR diagnostic function 24 can verify duty cycle or sine voltage calculations that occur in both the 1 ms rate time domain and motor control ISR time domains. Every calculation performed at these faster rates may be verified.

In one embodiment, the LRPR function outputs are calculated as a function of motor position as defined in a phase grounding table. The phase grounding table is broken up into different sectors, and based on which sector the motor position is in at a selected time, a predicted or expected duty cycle is generated for each motor phase. For example, for each motor phase, the phase grounding table includes expected duty cycle values and/or expected upper and lower duty cycle limits that are set for each sector. These limits may be calculated based on a motor control model.

The expected duty cycles are compared to the duty cycle outputs from the duty cycle function 22, and a diagnostic is set if the duty cycle outputs and the expected duty cycles are not in agreement. Exemplary duty cycle outputs for each phase A, B, and C are represented in FIG. 2 as captured duty cycles (Calculated Duty Cycles).

For example, a diagnostic is set if the output duty cycles do not match or are not within some range of the expected duty cycles, or if the output duty cycles are not within the upper and lower limits. The LRPR function 24 may also determine in which sectors, based on motor position, the output comparison is not required.

Figure 3:
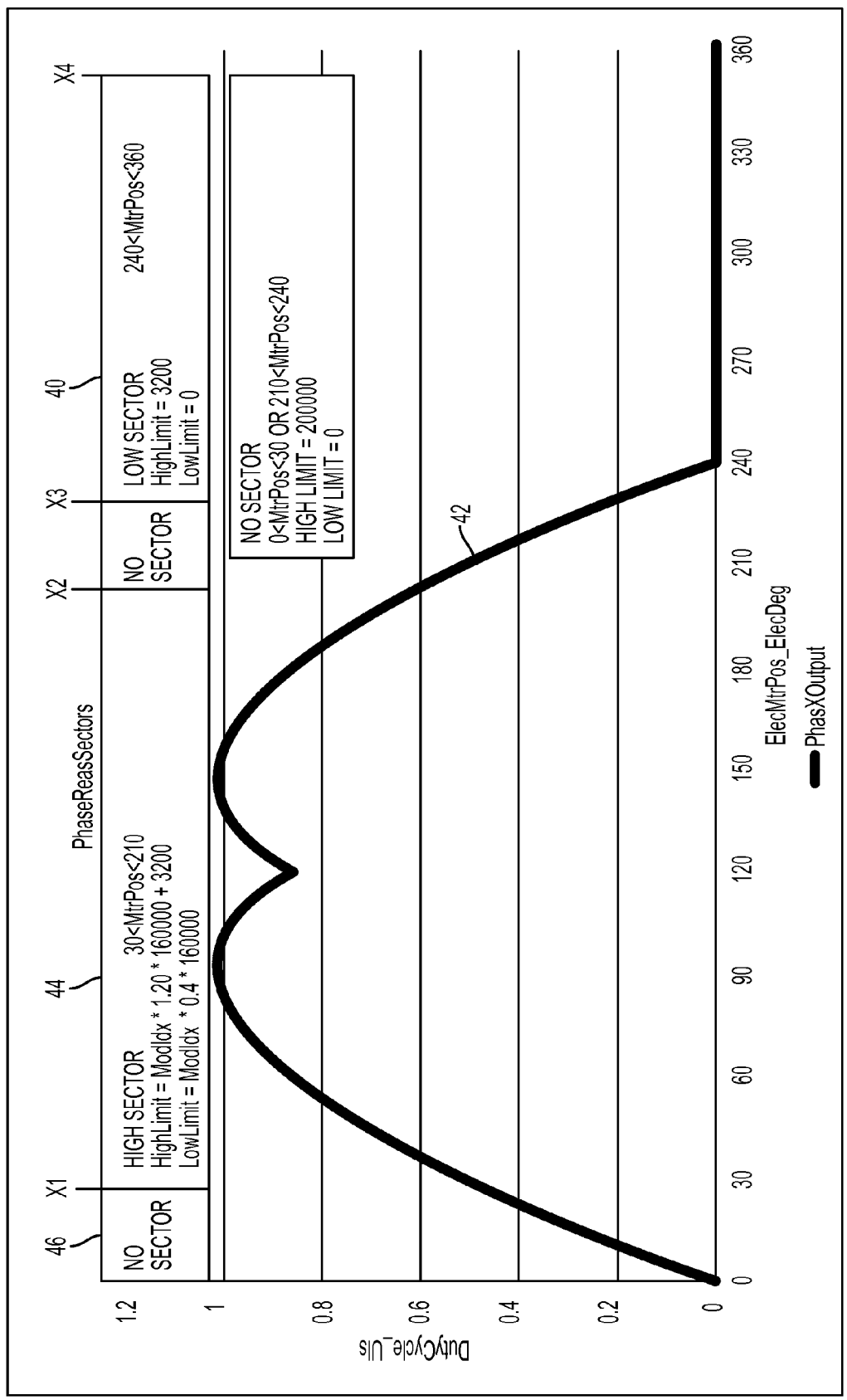
FIG. 3 depicts exemplary motor rotation sectors and predicted duty cycle information of the diagnostic function of FIG. 2.

FIG. 3 shows an exemplary grounding table and exemplary sectors used by the LRPR function 24. In this example, the phase grounding table is broken up into three sectors. The first sector is a low sector 40, which is between X3 and X4 electrical degrees (e.g., 240 and 360 degrees). In this sector, the output 42 of the phase grounding table is zero. The low limit in this sector would be zero, and the high limit in the sector is the maximum commutation offset per motor control loop times the maximum number of motor control loops in t3 ms.

The next sector is a high sector 44, which is between X1 and X2 electrical degrees (e.g., 30 and 210 degrees). In this sector, the output 42 of the phase grounding table ranges from 0.5 to 1.0.

The regions not defined as a high or low sector are shown as "no sectors" 46. Each no sector 46 is a transitional area where no determination is made. The low limit in this sector is zero and the high limit is the maximum number of phase output counts per t3 ms.

Figure 4:
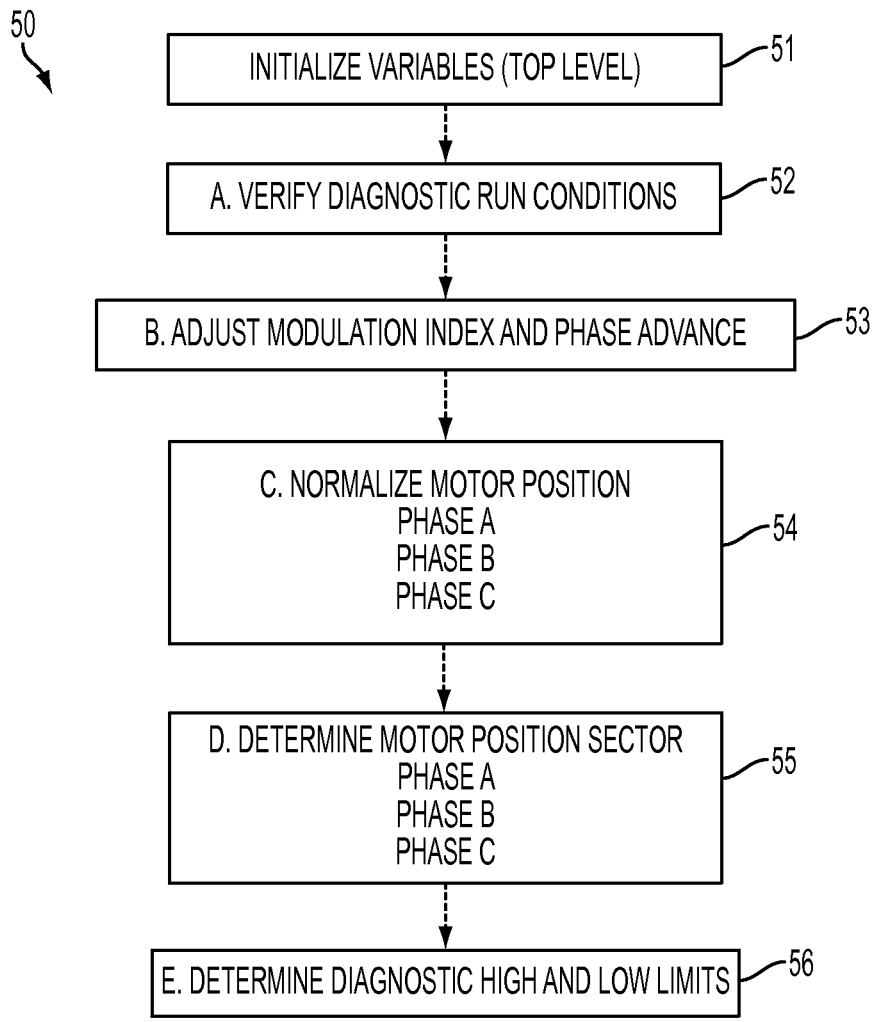
FIG. 4 is a flowchart depicting an embodiment of a method of monitoring and analyzing duty cycle outputs in an electric power steering system.

An exemplary diagnostic method 50 is shown in FIG. 4. In blocks 51 and 52, variables are initialized and diagnostic run conditions (e.g., sampling frequency, motor velocity constraints) are verified. At block 53, the modulation index and phase advance angles are adjusted and at block 54, motor position for each phase is normalized. At block 55, sectors are designated. At block 56, phase grounding tables for each phase are used to compare the duty cycle outputs from, e.g., the duty cycle function 22. In one embodiment, block 56 includes comparing the duty cycle outputs to high and low limits based on the sector.

As will be appreciated by one skilled in the art, aspects of the embodiment may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A motor control diagnostic system, comprising:
   a control module in communication with a multiple phase electric power steering motor, the control module configured to generate a duty cycle output for each phase of the motor based on a voltage command generated from a motor torque command and motor position; and
   a diagnostic module configured to, for each phase, derive an electrical revolution sector based on the motor position, estimate an expected duty cycle output based on the electrical revolution sector, analyze a reasonableness of the duty cycle output based on comparing the duty cycle output to the expected duty cycle output, and determining whether the duty cycle output is correct based on the comparing.

2. The system of claim 1, wherein the electrical revolution sector corresponds to an angular position of the motor, and includes a portion of a 360 degree electrical revolution of the motor.

3. The system of claim 1, wherein the expected duty cycle output for each phase is estimated based on at least one phase grounding table.

4. The system of claim 3, wherein the phase grounding table includes duty cycle values associated with each sector, the duty cycle values selected from at least one of expected duty cycle values associated with each sector and duty cycle limits for each sector.

5. The system of claim 3, wherein the at least one phase grounding table includes a phase grounding table for each individual motor phase.

6. The system of claim 1, wherein the diagnostic module is configured to simultaneously analyze the reasonableness of duty cycle outputs for each motor phase.

7. The system of claim 1, wherein the control module includes a duty cycle generation function configured to generate the duty cycle output for each phase based on the motor torque command, the motor position and a phase advance angle.

8. The system of claim 1, further comprising a position and velocity sensor that outputs a rotor angular position and velocity to the control module.

9. The system of claim 1, further comprising a phase voltage diagnostic function configured to receive the duty cycle output for each phase, generate physical phase voltages based on the duty cycle outputs, and provide diagnostic information based on the physical phase voltages.

10. The system of claim 1, wherein the diagnostic module is configured to output a diagnostic signal in response to a duty cycle output not agreeing with a corresponding expected duty cycle output.

11. The system of claim 1, wherein the diagnostic module is configured to output a diagnostic signal, the diagnostic signal indicating whether the duty cycle output for each phase is valid, and in response to one or more duty cycle outputs being invalid, the diagnostic signal indicating the electrical revolution sector in which each invalid duty cycle output occurs.

12. A method of performing diagnostics on an electrical power steering system, the method comprising:
   generating, at a control module, a duty cycle output for each phase of a multiple phase electric power steering motor based on a voltage command generated from a motor torque command and a motor position;

deriving an electrical revolution sector for each phase based on the motor position, and estimating an expected duty cycle output for each phase based on the electrical revolution sector; and analyzing, by a diagnostic module, a reasonableness of the duty cycle output for each phase based on comparing the duty cycle output to the expected duty cycle output, and determining whether the duty cycle output is correct based on the comparing.

13. The method of claim 12, wherein the expected duty cycle output for each phase is estimated based on at least one phase grounding table.

14. The method of claim 13, wherein the phase grounding table includes duty cycle values associated with each sector, the duty cycle values selected from at least one of expected duty cycle values associated with each sector and duty cycle limits for each sector.

15. The method of claim 13, wherein the at least one phase grounding table includes a phase grounding table for each individual motor phase.

16. The method of claim 12, wherein analyzing includes simultaneously analyzing the reasonableness of duty cycle outputs for each motor phase.

17. The method of claim 12, wherein generating includes generating the duty cycle output for each phase based on the motor torque command, the motor position and a phase advance angle.

18. The method of claim 12, further comprising providing diagnostic information based on physical phase voltages, the physical phase voltages generated based on the duty cycle outputs.

19. The method of claim 12, further comprising outputting a diagnostic signal in response to a duty cycle output not agreeing with the duty cycle values.

20. The method of claim 12, further comprising outputting a diagnostic signal, the diagnostic signal indicating whether the duty cycle output for each phase is valid, and in response to one or more duty cycle outputs being invalid, the diagnostic signal indicating the electrical revolution sector in which each invalid duty cycle output occurs.

\* \* \* \* \*